(12) United States Patent
Hiroshima

(10) Patent No.: US 7,179,694 B2
(45) Date of Patent: Feb. 20, 2007

(54) SEMICONDUCTOR DEVICE, ELECTRO-OPTICAL DEVICE, INTEGRATED CIRCUIT AND ELECTRONIC EQUIPMENT

(75) Inventor: Yasushi Hiroshima, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/095,954

(22) Filed: Apr. 1, 2005

(65) Prior Publication Data

US 2005/0233510 A1 Oct. 20, 2005

(30) Foreign Application Priority Data

Apr. 1, 2004 (JP) .............................. 2004-109087

(51) Int. Cl.
*H01L 21/00* (2006.01)
(52) U.S. Cl. ...................... 438/149; 438/150; 438/164; 438/166; 257/E29.151
(58) Field of Classification Search ........ 438/149–167; 257/E29.147, E29.151, E29.117, E29.273
See application file for complete search history.

(56) References Cited

U.S. PATENT DOCUMENTS

| 4,409,724 | A | * | 10/1983 | Tasch et al. ................... 438/30 |
| 5,262,654 | A | * | 11/1993 | Yamazaki ..................... 257/53 |
| 5,481,121 | A | * | 1/1996 | Zhang et al. .................. 257/64 |
| 2003/0160263 | A1 | * | 8/2003 | Hiroshima ................... 257/151 |

FOREIGN PATENT DOCUMENTS

JP 11-087243 3/1999

OTHER PUBLICATIONS

"Single Crystal Thin Film Transistors," IBM Tech. Bull., Aug. 1993, pp. 257-258.
R. Ishihara et al., "Advanced Excimer-Laser Crystallization Techniques of Si Thin-Film for Location Control of Large Grain on Glass," Proc. SPIE vol. 4295 (2001), pp. 14-23.
I. Mizushima et al., "Effect of Interfacial Oxide on Solid-Phase Epitaxy of Si Films Deposited on Si Substrates," J. Appl. Phys. 63(4), Feb. 15, 1998, pp. 1065-1069.

* cited by examiner

*Primary Examiner*—Brook Kebede
(74) *Attorney, Agent, or Firm*—Oliff & Berridge, PLC

(57) ABSTRACT

A method of manufacturing a semiconductor device includes an origin part forming process in order to form a plurality of origin parts, each of which serves as an origin for crystallization of a semiconductor film on a substrate, a semiconductor film forming process to form the semiconductor film on the substrate where the origin parts have been formed, and a thermal treatment process in which the semiconductor film is thermally treated in order to form a plurality of nearly single crystalline grains, each of which is almost centered at each of the plurality of origin parts. The method further includes a patterning process to carry out patterning the semiconductor film in order to form a transistor region and an element forming process to form a gate insulation film and a gate electrode on the transistor region so as to form a thin film transistor, wherein the origin parts are formed in such a manner that the nearly single crystalline grains are included in the source region and drain region of the patterning process.

9 Claims, 6 Drawing Sheets

SEMICONDUCTOR DEVICE, ELECTRO-OPTICAL DEVICE, INTEGRATED CIRCUIT AND ELECTRONIC EQUIPMENT

RELATED APPLICATION

This application claims priority to Japanese Application No. 2004-109087, filed Apr. 1, 2004, whose contents are explicitly incorporated herein by reference.

FIELD OF THE INVENTION

The present invention relates to a method of manufacturing a semiconductor device; and semiconductor device, an electro-optical device, an integrated circuit, and electronic equipment that are manufactured by the method thereof.

BACKGROUND

In electro-optical devices such as a liquid crystal display device and an organic EL (Electro Luminescence) display device and so on, a thin film circuit including a thin film transistor as a semiconductor element is used to implement switching a pixel element and so on. With a conventional thin film transistor, an amorphous silicon film is used to form active regions such as a channel forming region and so on. Meanwhile, a thin film transistor, in which active regions are formed by using a polycrystalline silicon film, is also put into practical use. In comparison to using an amorphous silicon film, using a polycrystalline silicon film makes it possible to improve electrical characteristics such as mobility and so on, and also to increase performance of the thin film transistor.

Moreover, in order to further improve performance of the thin film transistor; an advanced technique is under consideration to form a semiconductor film composed of larger crystalline grains which prevent a grain boundary from entering the channel forming region of the thin film transistor. For example; a technique has been proposed, in which a minute hole is formed on a substrate and crystallization of the semiconductor film is carried out while the minute hole is used as an origin of crystal growth so that a large-sized silicon crystalline grain is formed. Such a technique is described in Japanese Unexamined Patent Publication No. JP11087243, Literature "Single Crystal Thin Film Transistors"; IBM TECHNICAL DISCLOSURE BULLETIN August 1993 pp. 257–258", and Literature "Advanced Excimer-Laser Crystallization Techniques of Si Thin-Film For Location Control of Large Grain on Glass"; R. Ishihara et al., proc. SPIE 2001, vol. 4295 pp. 14–23".

By forming a thin film transistor with a silicon film having a large grain size according to the above-referenced prior art technique, it becomes possible to prevent a grain boundary from entering a forming region (a channel forming region, in particular) of a thin film transistor. Thus, it becomes possible to realize a thin film transistor that is excellent in electrical characteristics such as mobility and so on.

SUMMARY OF THE INVENTION

As a thin film transistor enhances its performance, the need for a lower resistance of the source region and the drain region becomes evident. The reason is as described below, that is even if only the channel forming region provides excellent crystallinity that the resistance of the pertinent part becomes low under condition where the thin film transistor is ON, the entire performance of the thin film transistor does not become excellent unless the resistance of the source region and the drain region is sufficiently low, because a carrier (including an electron and a hole) flows through the entire part of the source region, channel forming region, and drain region.

Generally speaking, for a source region and a drain region an impurity is injected into a semiconductor film, and then adequate thermal treatment is carried out later to recover crystallinity of the injection part so as to activate the impurity. Temperature of the thermal treatment on this occasion needs to be relatively low if a glass substrate is used, and therefore sufficient activation cannot actually be realized so that only the source region and drain region having a rather high resistance value can be formed.

Therefore, the purpose of the present invention is to provide a method of manufacturing a semiconductor device, in which activation of the impurity of the source region and drain region can be realized by thermal treatment at relatively low temperature so that a thin film transistor with high performance can be obtained.

According to an illustrative aspect, the present invention provides a method of manufacturing a semiconductor device, in which a thin film transistor is formed by using a semiconductor film on a substrate, at least one of whose surfaces is insulative. The method includes an origin part forming process in order to form a plurality of origin parts, each of which works as an origin for crystallization of the semiconductor film on the substrate; a semiconductor film forming process to form the semiconductor film on the substrate where the origin parts have been formed; a thermal treatment process in which the semiconductor film is thermally treated in order to form a plurality of nearly single crystalline grains, each of which is almost centered at each of the plurality of origin parts; a patterning process to carry out patterning the semiconductor film in order to form a transistor region that includes a source region, a drain region, and a channel forming region; and an element forming process to form a gate insulation film and a gate electrode on the transistor region so as to form a thin film transistor, wherein the origin parts are formed in the origin part forming process in such a manner that the nearly single crystalline grains are included in the source region and the drain region of the patterning process.

By application of the method described above, nearly single crystalline grains with high performance are formed as a semiconductor film by using each of origin parts, which serves as an origin; wherein the origin parts are formed in such a manner that the nearly single crystalline grains are included in the source region and drain region. Therefore, if an impurity is injected into the source region and drain region, the thermal treatment activates the impurity at relatively low temperature so that it is possible to decrease a parasitic resistance of the source and drain regions.

Each of "the origin parts" serves as an origin of crystal growth, and the thermal treatment makes each crystalline grain of the nearly single crystalline grains grow from each of the origin parts.

There exists no restriction regarding the definition of "semiconductor film", which includes polycrystalline semiconductor films as well as amorphous semiconductor films for example.

"Being almost centered" does not mean "being centered geometrically", but means that it is positioned around the center of each of the nearly single crystalline grains right after their growth in order to be an origin of the crystal growth as described above.

"The nearly single crystalline grains" can include regular grain boundaries (applicable grain boundaries) such as Σ3, Σ9, and Σ27; but excludes any irregular grain boundaries.

Furthermore, "the origin parts" are concave parts, for example, formed on the substrate. If the parts are formed to be concave, the crystalline grain growth through the course of the thermal treatment starts from the bottom of each of the concave parts. The diameter of each of the concave parts can be equal to or somewhat smaller than the diameter of each grain of the polycrystalline semiconductor.

Furthermore, the thermal treatment process can be carried out by laser irradiation. When laser irradiation is applied, it becomes easier to efficiently supply a part of the semiconductor film with energy so as to melt only the specified part and accordingly grow the nearly single crystalline grains.

Moreover, according to an another aspect the present invention further includes an impurity introducing process in which an impurity is introduced from the gate insulation film and the gate electrode into the source region and the drain region; and a crystallinity recovery process in which crystallinity of the source region and the drain region is recovered by carrying out thermal treatment for the source region and the drain region into which the impurity has been introduced. Applying the present invention makes it possible to sufficiently recover the crystallinity of the entire crystalline grains by thermal treatment so as to realize activation of the impurity element. Therefore, eventually it becomes possible to decrease the resistance of the source region and drain region.

Furthermore, aspects of the present invention also provide a semiconductor device including a thin film transistor, which is formed with a semiconductor film formed on a substrate, wherein the semiconductor film includes a plurality of nearly single crystalline grains that have been formed by using a plurality of origin parts. Each of the origin parts works as an origin, formed on the substrate, and the semiconductor film with a source region and a drain region of the thin film transistor is patterned so as to include the nearly single crystalline grains. The semiconductor device is manufactured, for example, by the above-described method of manufacturing a semiconductor device, in which the source region and drain region include the nearly single crystalline grains, and therefore, if an impurity is injected into the source region and drain region, the impurity is activated by thermal treatment at relatively low temperature so that it is possible to decrease a parasitic resistance of the regions.

Under this situation, the origin parts can be concave parts formed on the substrate. If the parts are formed to be concave, the crystalline grain growth through the course of the thermal treatment starts from each bottom of the concave parts. According to this aspect, the diameter of each of the concave parts can be equal to or somewhat smaller than the diameter of each grain of the polycrystalline semiconductor.

Furthermore, the origin parts are formed in the source region and the drain region of the thin film transistor, or their adjacent regions. According to this arrangement, the source region and drain region are formed with the nearly single crystalline grains that have grown as crystalline grains from the origin parts; and therefore, it is possible to provide a semiconductor film with high performance. According to this aspect, the distance of the "adjacent regions" is equivalent to the size (radius) of each of the crystalline grains. For example, for purposes of this invention the distance between the "adjacent regions" means a distance of 3 micrometers or shorter.

DETAILED DESCRIPTION OF THE INVENTION

The following sections explain aspects of the present invention with reference to the accompanying drawings.

A manufacturing method according an illustrative implementation of the present invention comprises: (1) a process of forming minute holes as concave parts, each concave part serving as an origin of crystallization of a silicon film as a semiconductor film on a substrate, (2) a process of growing and forming silicon crystalline grains that starts from the minute holes, and (3) a process of forming a thin film transistor by using a silicon film that includes the silicon crystalline grains. Each of these is described in detail in the following sections.

(1) Minute Hole Forming Process

Figure 1A:
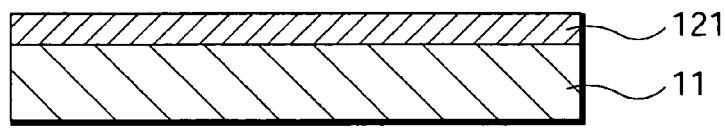
FIGS. 1A–1E show the manufacturing process of forming a minute hole and forming a nearly single crystalline silicon grain.
Figure 1B:
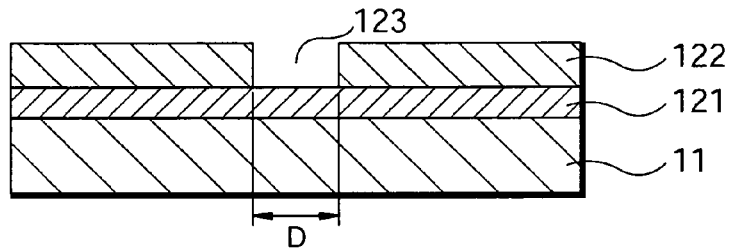
Figure 1C:
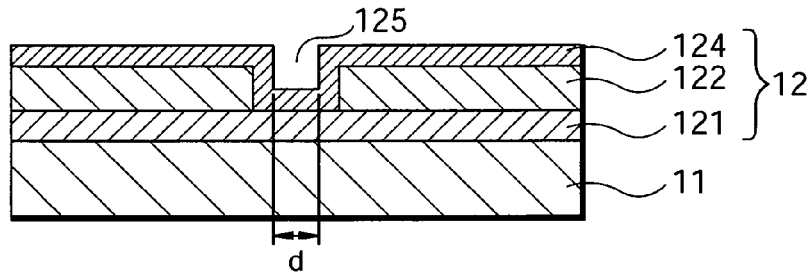

As FIG. 1A shows, a silicon oxide film 121 is formed as a front-end insulating film on a glass substrate 11. Thickness of the film is, for example, around 200 nanometers; Next, another silicon oxide film is formed as a first insulating film 122 with its thickness of 550 nanometers on the front-end insulating film 121. Then, a hole 123 having a diameter D around 1 micrometer or less is formed in the first insulating film 122 (See FIG. 1B). An illustrative method of forming the hole is described. Exposure and development is carried out for a photo-resist film applied on the first insulating film 122 while using a mask in order to form a photo-resist film (not illustrated in the drawing). The photo-resist film is provided with an opening that exposes a position to form the hole 123 in the first insulating film 122. Then, reactive ion etching is implemented by using the photo-resist film as an etching mask, and subsequently the photo-resist film is removed to complete forming the hole 123. Next, still another silicon oxide film serving as a second insulating film 124 is formed on the first insulating film 122 that includes the hole (See FIG. 1C). By adjusting the deposition thickness of the second insulating film 124, the diameter D of the hole 123 is narrowed so as to make the minute hole 125 provided with a diameter d around 20 nanometers to 150 nanometers as a concave part of the present invention. All of these films, i.e., the front-end insulating film 121, the first insulating film 122, and the second insulating film 124 (These layers are also collectively referred to as insulating layer 12) can be formed by PECVD method in which TEOS (Tetra Ethyl Ortho Silicate) and/or silane gas (SiH4), for example, are used as raw materials.

In the present invention, the minute hole 125 is characteristically formed in a channel forming region, a source region, and a drain region of a thin film transistor formed in a process to be described later. In this example, the clearance between the minute hole and an adjacent minute hole is around 6 microns or less. The distance is almost equivalent to the size (diameter) of a silicon crystalline grain grown by laser irradiation to be described later, while the growth starts from each of the minute holes 125. Thus, in the source region, channel forming region, and drain region, silicon crystalline grains, whose growth has started from each of the minute holes 125, are continuously laid out. The minute holes 125 can be formed at positions under the contact holes, to be described later, or at their neighboring positions, wherein the contact holes are formed in the source region and drain region.

(2) Crystalline Grain Forming Process

Figure 1D:
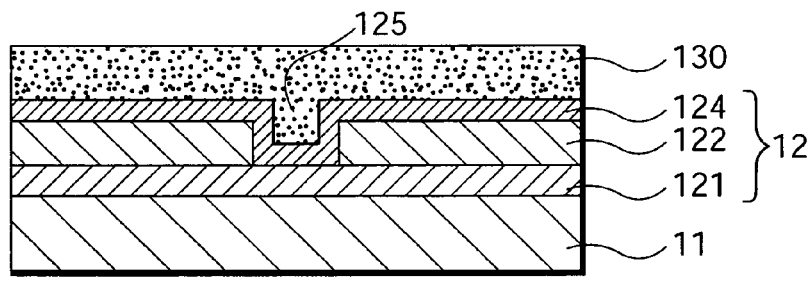

As FIG. 1D shows; an amorphous silicon film 130, to be used as a semiconductor film, is formed on a silicon oxide film as the second insulating film 124 as well as in the minute hole 125 by using a film manufacturing method such as LPCVD method and/or PECVD method. The amorphous silicon film 130 can be formed so as to have its thickness around 50 to 300 nanometers. Furthermore, it is also possible to form a polycrystalline silicon film 13 instead of the amorphous silicon film 130 as show in FIG. 1D. When such a silicon film 13 is formed by LPCVD method and/or PECVD method, the hydrogen content in the silicon film 13 may be rather high. In such a case, to prevent ablation of the silicon film 13 at the time of laser irradiation, it is recommended to carry out thermal treatment in order to decrease the hydrogen content in the silicon film to 1% or less.

Figure 1E:
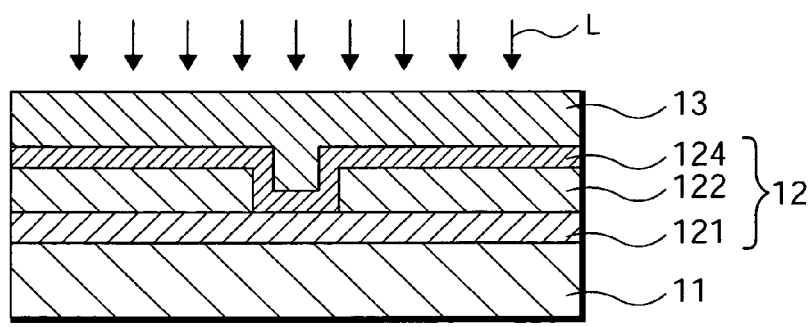

Next, laser irradiation 'L' is carried out for the silicon film 13 as shown in FIG. 1E. For the laser irradiation, the laser irradiation can be carried out by using a XeCl pulse exima laser with a pulse wavelength of 308 nanometers and pulse width of 20 to 30 nanoseconds, or a XeCl exima laser with a pulse width around 200 nanoseconds, for example, while the energy density is around 0.4 to 2.0 J/cm2. If laser irradiation is implemented under such conditions as described above, most of the radiated laser is absorbed into an area around the surface of the silicon film. This occurs because the absorption coefficient of amorphous silicon is fairly large, i.e., 0.139 nanometer-1, at the wavelength (308 nanometers) of XeCl pulse exima laser.

By properly setting the conditions of the laser irradiation 'L', the silicon film can be formed such that a non-melted part remains at the bottom of the minute hole 125, while all other parts are provided in an almost completely melted condition. As a result of the above arrangements, after the laser irradiation starts silicon crystal growth starts initially at around the bottom of the minute hole, and then it progresses toward the area around the surface of the silicon film 13; that is to say, the part provided in an almost completely melted condition. Even in a case where energy of the laser irradiation 'L' is a bit higher than the condition described above such that no non-melted part remains at the bottom of the minute hole 125, after the laser irradiation starts the silicon crystal growth still starts initially at around the bottom of the minute hole 125 and it progresses toward the area around the surface of the silicon film 13; that is to say, the part provided in an almost completely melted condition in the same manner as the foregoing process develops, due to a temperature difference between the area around the surface of the silicon film 13 provided in an almost completely melted condition and the bottom of the minute hole 125.

Figure 2:
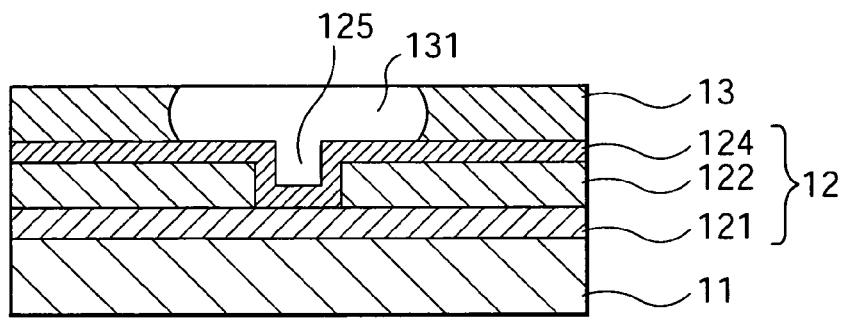
FIG. 2 shows the results of a step in the manufacturing process of forming a nearly single crystalline silicon grain.
Figure 3A:
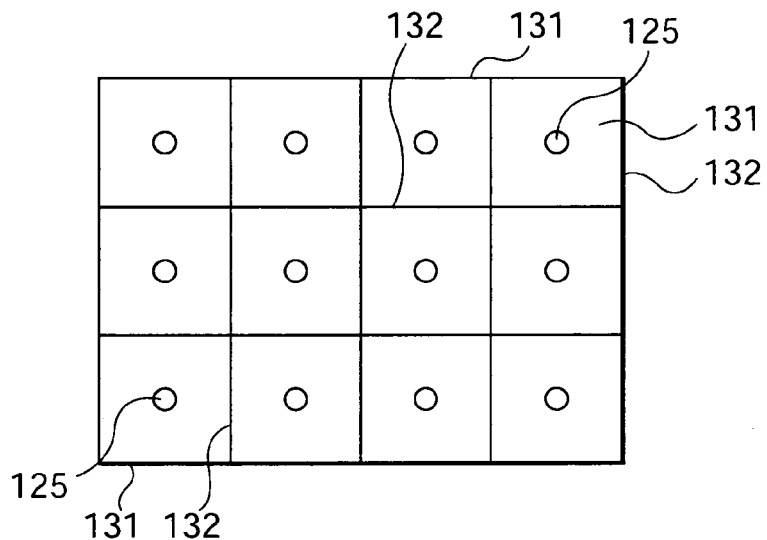
FIGS. 3A and 3B illustrate plan views of the layout of minute holes in a case where the nearly single crystalline silicon grains are formed and the relationships between the minute hole layout and the corresponding shape of the nearly single crystalline grains formed according to the layout.

In an initial stage of silicon crystal growth, several crystalline grains 131 can grow at the bottom of the minute hole 125 as shown in FIG. 2. According to this aspect, by making the sectional dimension of the minute hole 125 (i.e., diameter of the hole in the present embodiment) nearly the same size as one crystalline grain or a bit smaller, only one crystalline grain reaches the top part (opening) of the minute hole 125. Accordingly, in the part of the silicon film 13 in the almost completely melted condition, the crystal growth progresses while each crystalline grain, having reached the top part of the minute hole 125, function as a core. Then, as shown in FIG. 3A, it becomes possible to form a silicon film in which a plurality of nearly single crystalline silicon grains 131 large in grain size can be laid out in a regular manner with each of the grains being almost centered at the minute hole 125.

In this aspect, the nearly single crystalline silicon grains can include regular grain boundaries (applicable grain boundaries) such as $\Sigma3$, $\Sigma9$, and $\Sigma27$; but exclude any irregular grain boundaries. In general, irregular grain boundaries include so many silicon unpaired electrons that they become a primary cause of deterioration in characteristics and unevenness of properties of the thin film transistor to be manufactured. However, the nearly single crystalline silicon grains to be manufactured by the present method do not include such irregular grain boundaries, and therefore a thin film transistor provided with excellent properties can be realized by forming the thin film transistor in the nearly single crystalline silicon grains. But, if the minute hole 125 has a diameter around 150 nanometers or more, a plurality of crystalline grains generated at the bottom of the minute hole 125 can grow so as to reach the top part of the minute hole. As a result, the silicon crystalline grains, each of which is almost centered at the minute hole 125, can include irregular grain boundaries.

Furthermore, the glass substrate can also be heated at the time of crystallization by the laser irradiation 'L' described above. For example, to make the temperature of the glass substrate around 200 to 400 degrees Celsius, a heating operation is recommended by, for example, using a stage on which the glass substrate is installed. Thus, by applying laser irradiation and heating the substrate collectively, it becomes possible to make the crystalline grain size of each of the nearly single crystalline silicon grains 131 even larger. In contrast to not applying the heating operation described above, heating the substrate together enables the size of the nearly single crystalline silicon grains 131 to be made around 1.5 to 2 times larger. Furthermore, since heating the substrate makes the progress of crystallization slower, another advantage can be realized in that the crystallinity of the nearly single crystalline silicon grains can be improved even further.

As described above, by forming the minute hole 125 at a required position on the substrate 11, it becomes possible to form each of the nearly single crystalline silicon grains 131 with relatively good crystallinity, while each of the grains is almost centered at the minute hole 125 after the laser irradiation. Furthermore, it has been recognized that crystallinity is superior in any area other than the area adjacent to the minute hole 125 in each of the crystalline grains 131, and continuous crystallinity is maintained in the direction of the film thickness (No applicable grain boundary exists in the direction parallel to the internal film surface).

On the other hand, a part of the silicon film 13 that does not have the minute hole 125 formed therein (i.e., a part of the silicon film 13 that is sufficiently away from the minute hole 125) enters an almost completely melted condition due to the laser irradiation, and isotropic core generation and crystal growth develop after the laser irradiation so as to form a polycrystalline silicon film including a plurality of fine crystalline grains. Depending on the condition of the laser irradiation, the fine crystalline grains around 0.5 microns or smaller can be laid out in an irregular manner in order to form the polycrystalline silicon film.

(3) Thin Film Transistor Forming Process

Next, the following sections explain the structure of a thin film transistor to be formed by using the silicon film described above. Under present conditions, the crystalline grain diameter of the nearly single crystalline silicon grains 131 to be obtained by crystallization using the minute hole 125 as an origin is around 6 microns.

Figure 4A:
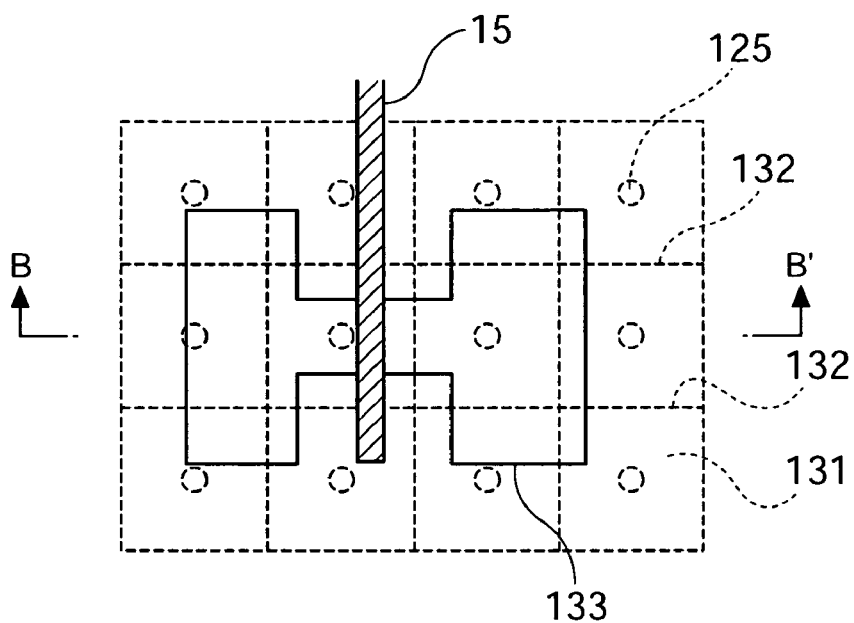
FIGS. 4A and 4B illustrate plan views of a thin film transistor including a gate electrode and active regions (source region, drain region, and channel forming region) according to aspects of the invention.
Figure 4B:
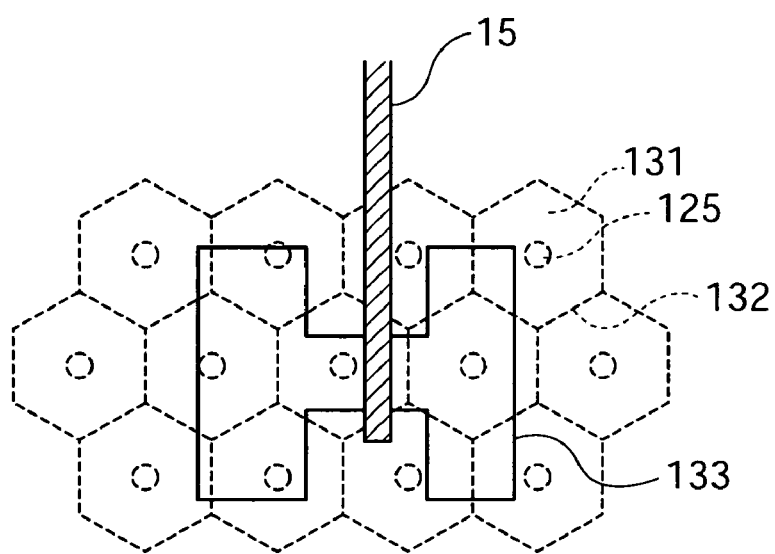
Figure 5A:
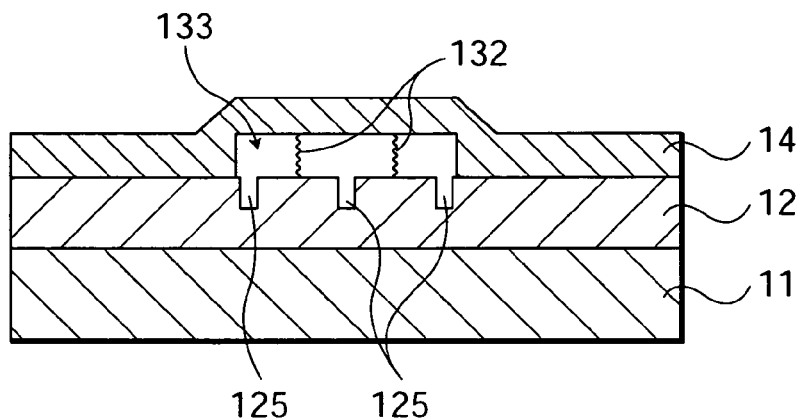
FIGS. 5A–5C illustrate points in the manufacturing process of forming a thin film transistor according to aspects of the present invention.
Figure 5B:
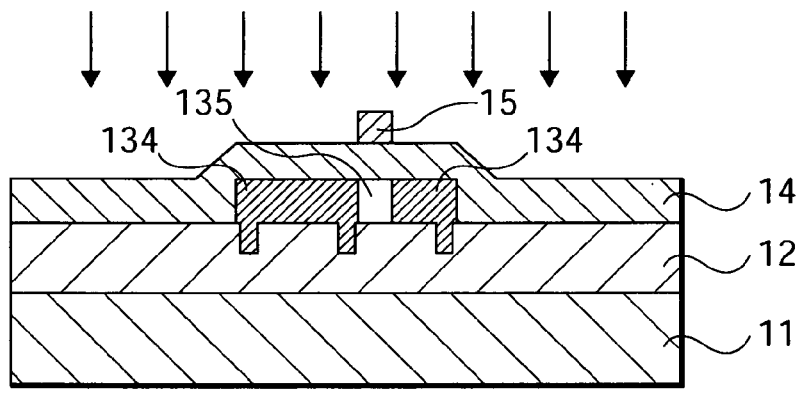
Figure 5C:
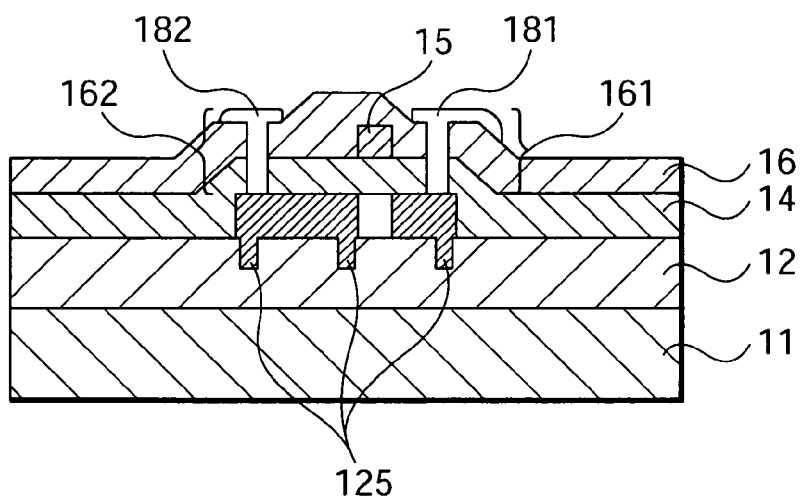

A manufacturing process to form a thin film transistor 'T' is explained here. FIGS. 4A and 4B and FIGS. 5A–5C are drawings to explain the manufacturing process to form the thin film transistor 'T'. FIG. 4A and FIG. 4B illustrate plan views of the thin film transistor after completion of manufacturing, while FIG. 5A to FIG. 5C show sectional views at B–B' in FIG. 4A.

Figure 3B:
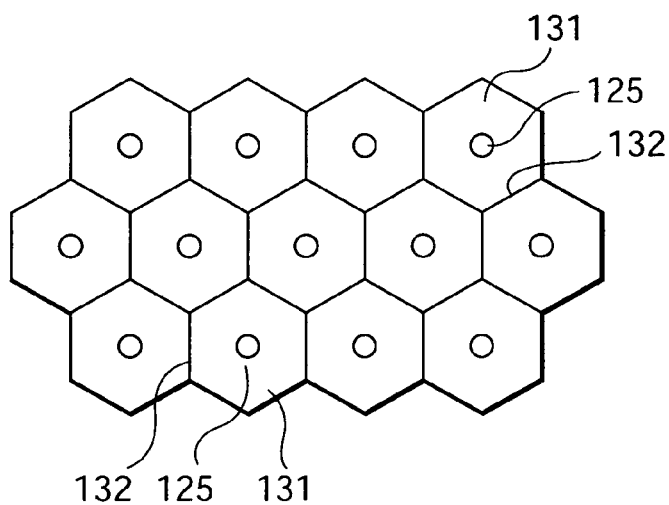

As shown in FIG. 3A, by laying out the minute hole 125 in plural numbers at intervals of 6 microns or less, the plurality of the nearly single crystalline silicon grains 131 can be formed while contacting each other. There is no restriction on the layout of the minute holes 125 at this time. Possible layouts include, for example, the layout shown in FIG. 3A in which the minute holes 125 are laid out at regular intervals in both the horizontal and vertical directions, and the layout shown in FIG. 3B in which the minute holes 125 adjacent to each other are laid out at regular intervals.

Thus, while using a silicon film in which the plurality of the nearly single crystalline silicon grains 131 are laid out, patterning of the silicon film can be carried out to remove any part that is not required for forming a thin film transistor to form a patterned silicon film 133. At this time, a channel forming region 135 of the thin film transistor does not include any minute holes 125 and their adjacent parts. This is because much disorder exists in the crystallinity at the minute holes 125 and their adjacent parts. Furthermore, in a part that becomes a source and drain region 134 as well as the source and drain region 134 that corresponds to a position where a contact hole is formed in a later manufacturing process, the nearly single crystalline grains can be placed.

As shown in FIG. 5A, a silicon oxide film 14 is formed on the surfaces of a silicon oxide film as the second insulating film 124 (12) and the patterned silicon film 133 by Electron-Cyclotron-Resonance PECVD method (i.e., ECR-PECVD method) or a parallel plane type PECVD method and so on. The silicon oxide film 14 functions as a gate insulation film of the thin film transistor, where its film thickness can be around 10 to 150 nanometers.

Next as shown in FIG. 5B, after forming a metal thin film of tantalum, aluminum, and so forth by a film forming method such as a spattering method, a gate electrode 15 and a gate wiring film are formed by implementation of patterning. Then, while using the gate electrode 15 as a mask, by implementation of so-called self-align ion plantation, in which an impurity element to become a donor or an acceptor is injected, the source and drain region 134 and the channel forming region 135 are formed in the silicon film 133. In this embodiment, for example, phosphorus (P) is injected as an impurity element, and then afterward, crystallinity of the silicon crystalline grains damaged by the injection of the impurity element are recovered and the impurity element is activated by thermal treatment at a temperature around 450 degrees Celsius.

Figure 6A:
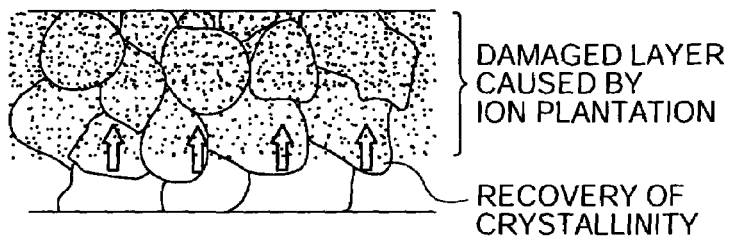
FIGS. 6A and 6B illustrate aspects of recovery of crystallinity of a silicon film by thermal treatment according to aspects of the present invention.

According to this aspect, if no minute hole is formed in the source and drain region and their adjacent area as in the conventional method, the silicon film of the source and drain region becomes completely melted in the laser irradiation step of the manufacturing process described above, and there becomes a fine crystalline film in which fine crystalline grains are irregularly laid out after laser irradiation (See FIG. 6A). Therefore, even if an impurity element is injected and the thermal treatment is carried out, a large resistance still remains since a lot of crystalline grain boundaries exist even though crystallinity gets recovered and the impurity element is activated in each of the crystalline grains. Furthermore, when the solid-phase epitaxial growth described in I. Mizushima et al., J. Appl. Phys., 63, pp. 1065–1069 (1988), and/or Doctoral Thesis by Kanamoto, Tohoku University, 2001) is taken into consideration, within a crystalline grain including an area that has not been damaged by injecting the impurity, it is expected that crystallinity is recovered by solid-phase epitaxial growth starting from the area. However, if the entire crystalline grains have been damaged by injecting the impurity (i.e., the crystalline grains positioned around the surface), it is not expected to recover crystallinity by solid-phase epitaxial growth. In this instance, a sufficient decrease in the resistance in the source and drain region cannot be realized.

Figure 6B:
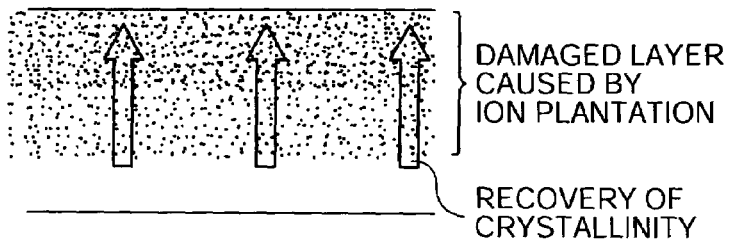

On the other hand, if the minute holes are formed in the source and drain region 134 according to aspects of the present invention, it becomes possible to form and place the nearly single crystalline silicon grains 131 with great grain size in accordance with the laser irradiation step of by the manufacturing process described above. Therefore, even if the nearly single crystalline silicon grains 131 have realized damage to crystallinity around their surfaces due to injecting the impurity element as FIG. 6B shows, crystallinity of the entire crystalline grains can be sufficiently recovered by applying a thermal treatment to cause activation of the impurity element. This is because, as described above, the nearly single crystalline silicon grains 131 do not have any grain boundary advantageously in the direction of the internal film surface, and the solid-phase epitaxial growth starting from an area around the silicon film rear surface (adjacent to the interface to the second insulating film 124) having little or no damage to crystallinity can be realized by applying the thermal treatment around the surface of the silicon film 133 where crystallinity has been damaged due to injection of the impurity. As a result, it becomes possible to decrease the resistance in the source and drain region 134.

Next, as FIG. 5C shows, another silicon oxide film 16 having a film thickness around 500 nanometers is formed on the silicon oxide film as the gate insulation film 14 and the gate electrode 15 by a film manufacturing method such as PECVD method. The silicon oxide film 16 functions as an inter-layer insulation film. Next, passing through the inter-layer insulation film 16 and the gate insulation film 14, contact holes 161 and 162 which reach each of the source and drain region are formed. Then, the contact holes 161 and 162 are filled with metals such as aluminum, tungsten, and so forth by a film manufacturing method such as a spattering method, and subsequently, pattering is implemented in order to form a source electrode 181 and a drain electrode 182.

According to this aspect, the nearly single crystalline silicon grains 131 grown from the minute holes 125 can also be laid out at a part of the silicon film 131 which, being located at the positions of the contact holes 161 and 162, contacts the source electrode 181 and the drain electrode 182. This is because, as already described above; decreasing resistance is implemented by activating the impurity element in the part of the nearly single crystalline silicon grains; and therefore, a good electrical connection can be achieved between the source electrode 181 and the drain electrode 182, both of which are metal films, and the silicon film 133.

Incidentally, this embodiment explains a case in which different pieces of the nearly single crystalline grains are independently used as a nearly single crystalline silicon grain in which the channel forming region 135 is formed, and another nearly single crystalline silicon grain in which the source and drain region 134 is formed, in a thin film transistor. However, forming the channel forming region as well as the source and drain region within a nearly single crystalline silicon grain, while making a thin film transistor finer, can bring essentially the same effect as realized by the above-described embodiment.

By the manufacturing method described above, the thin film transistor of the present embodiment is formed.

Next, application examples of the thin film transistor relating to the present invention are explained. The thin film transistor relating to the present invention can be used as a switching element for a liquid crystal display, and/or a driving element for an organic electroluminescent display unit.

Figure 7:
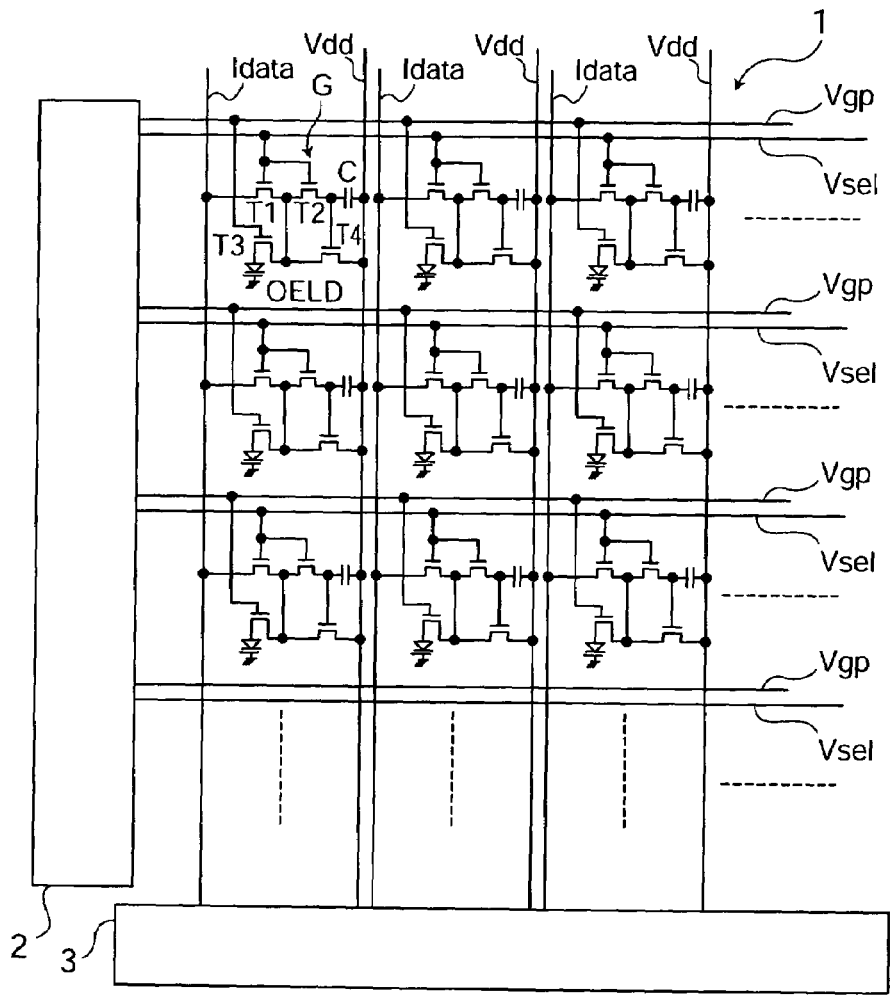
FIG. 7 shows a connecting condition of a display unit as an example of an electro-optical unit according to aspects of the present invention.

FIG. 7 is shows a connecting condition of a display unit 1 as an example of an electro-optical unit of the present embodiment. As shown in FIG. 7, the display unit 1 is constructed by an arrangement of a plurality of pixel regions 'G' in the display area. Each of the pixel regions 'G' uses thin film transistors 'T1' to 'T4' to drive an organic electroluminescent light emitting element 'OELD'. The thin film transistors 'T1' to 'T4' are manufactured by the manufacturing method of the embodiment described above. From a driver section 2, a light emitting control line (Vgp) and a writing control line (Vsel) are coupled to each of the pixel regions 'G'. From a driver section 3, a current line (Idata) and a power supply line (Vdd) are coupled to each of the pixel regions 'G'. By controlling the writing control line 'Vsel' and the constant current line 'Idata', a current program for each of the pixel regions 'G' is executed, while light emission is controlled by controlling the light emitting control line 'Vgp'. Furthermore, the transistor of the present invention can also be used in the driver section 2 and the driver section 3 for the thin film transistors 'T1' to 'T4'. A transistor manufactured according to aspects of the present invention is useful for any service that requires a great current, such as a buffer circuit for selection of the light emitting control line 'Vgp' and the writing control line 'Vsel' included in the driver section 2 and the driver section 3.

FIGS. 8A–8F show examples of electronic devices in which the display unit 1 can be applied. The display unit 1 described above can be applied for various kinds of electronic devices in addition to those described herein.

Figure 8A:
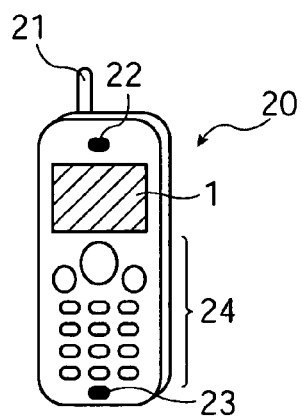
FIGS. 8A–8F illustrate examples of electronic devices in which a display unit according to aspects of the present invention can be applied.

FIG. 8A shows an example of an application for a cellular phone. The cellular phone 20 is equipped with an antenna part 21, a voice output part 22, a voice input part 23, an operation part 24, and a display unit 1 of the present invention. Thus, the display unit 1 of the present invention can be used as a display section.

Figure 8B:
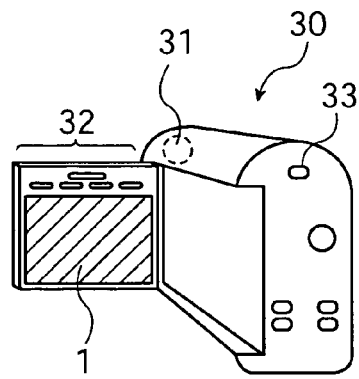

FIG. 8B shows an example of an application for a video camera. The video camera 30 is equipped with an image capture part 31, an operation part 32, a voice input part 33, and a display unit 1 of the present invention. Thus, the display unit 1 of the present invention can be used as a finder and a display section.

Figure 8C:
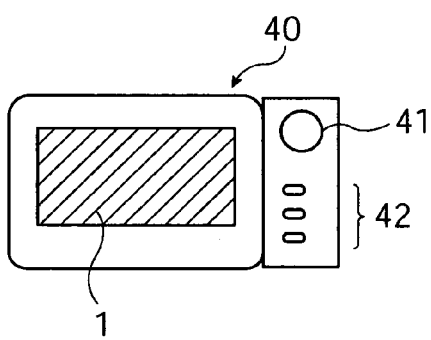

FIG. 8C shows an example of an application for a portable personal computer (so-called 'PDA', i.e., Personal Digital Assistant). The computer 40 is equipped with a camera part 41, an operation part 42, and a display unit 1 of the present invention. Thus, the display unit 1 of the present invention can be used as a display section.

Figure 8D:
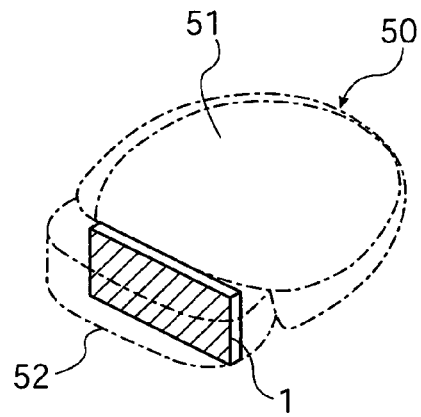

FIG. 8D shows an example of an application for a head-mounting display. The head-mounting display 50 is equipped with a band 51, an optical system storage part 52, and a display unit 1 of the present invention. Thus, a display unit 1 of the present invention can be used as an image display device.

Figure 8E:
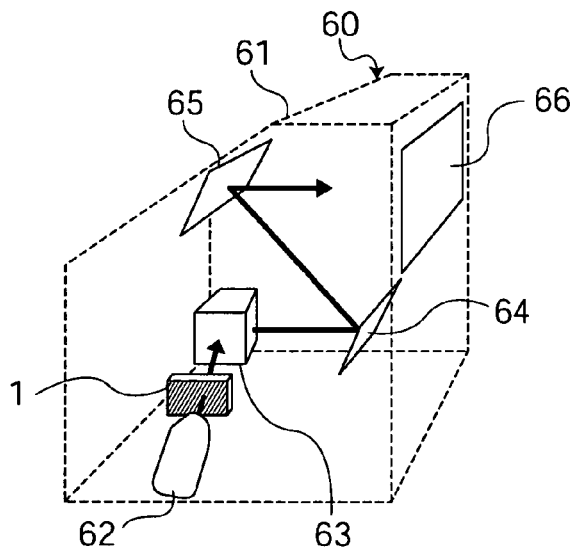

FIG. 8E shows an example of an application for a rear type projector. The projector 60 is equipped with a cabinet 61, a light source 62, a synthetic optical system 63, mirrors 64 and 65, a screen 66, and a display unit 1 of the present invention. Thus, the display unit 1 of the present invention can be used as an image display device.

Figure 8F:
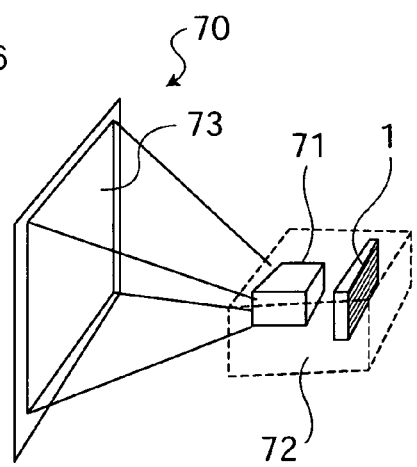

FIG. 8F shows an example of an application for a front type projector. The projector 70 is equipped with a cabinet 72, an optical system 71, and a display unit 1 of the present invention to make it possible to display an image onto a screen 73. Thus, the display unit 1 of the present invention can be used as an image display device.

The display unit 1 using the transistor of the present invention can be used not only for the example described above but also for any other electronic devices that employs active type and/or passive matrix type liquid crystal display units and organic electroluminescent display units. For example, in addition to all the application examples described above; a fax machine equipped with a display function, a finder of a digital camera, a portable type TV, an electronic pad, an electronic bulletin board, an advertisement display, and others can also make use of the display unit.

Furthermore, it is also possible to make a combination of the manufacturing method of the semiconductor device relating to the embodiment described above and the element transfer technology. By employing the method relating to the embodiment described above, a semiconductor device is formed on a first substrate that works as a transfer source. Then, the semiconductor device is transferred (moved) onto a second substrate that serves as a transfer destination. Regarding the first substrate, it is possible to use a substrate that is provided with favorable conditions (shape, size, physical properties, and so on) for making the semiconductor film and subsequently forming the elements, so that it becomes possible to form fine semiconductor elements with high performance on the first substrate. Furthermore, the second substrate is free from restrictions regarding the element forming process, and it becomes possible to manufacture a substrate having a large area. Also, any desired substrate can be used such as inexpensive substrates, like synthetic resins, caustic glasses, etc., plastic films provided with flexibility, and so forth. As a result, it becomes possible to easily form fine and high-performance thin film semiconductor elements on a large-sized substrate (with low cost).

The invention claimed is:

1. A method of manufacturing a semiconductor device, the method comprising:

forming a plurality of origin parts;

forming a first semiconductor film over the plurality of origin parts;

converting the first semiconductor film into a second semiconductor film that includes a plurality of nearly single crystalline grains, the converting of the first semiconductor film into the second semiconductor film using the plurality of origin parts as origins for growth of the plurality of nearly single crystalline grains; and forming a transistor that includes a gate insulation film, gate electrode, a source region, a drain region and a channel region such that at least one of the source region and the drain region includes at least one nearly single crystalline grain of the plurality of nearly single crystalline grains.

2. The method according to claim 1, each of the plurality of origin parts being a concave part formed in a substrate.

3. The method according to claim 1, the converting of the first semiconductor film into the second semiconductor film being carried out by treating the first semiconductor film thermally.

4. The method of according to claim 1, the converting of the first semiconductor film into the second semiconductor film being carried out by an irradiation of the first semiconductor film with a light.

5. The method according to claim 1, each of the plurality of nearly single crystalline grains being centered at one origin part of the plurality of origin parts.

6. The method according to claim 1, further comprising:

introducing an impurity through at least a part of the gate insulation film into the at least one of the source region and the drain region; and recovering crystallinity of the at least one of the source region and the drain region.

7. The method according to claim 6, the recovering of crystallinity of the at least one of the source region and the drain region including a thermal treatment of the at least one of the source region and the drain region.

8. A method of manufacturing a semiconductor device, the method comprising:

forming a plurality of origin parts;

forming a semiconductor film over the plurality of origin parts;

enhancing crystallinity of the semiconductor film such that the semiconductor film includes a plurality of crystalline grains, the enhancing of crystallinity of the semiconductor film using the plurality of origin parts as origins for growth of the plurality of crystalline grains; and forming a transistor that includes a gate insulation film, a gate electrode, a source region, a drain region and a channel region such that at least one of the source region and the drain region includes at least one crystalline grain of the plurality of crystalline grains.

9. The method according to claim 8, further comprising:

introducing an impurity through at least a part of the gate insulation film into at least one of the source region and the drain region; and recovering crystallinity of the at least one of the source region and the drain region.

* * * * *